(12) United States Patent
Gibson et al.

(10) Patent No.: US 10,043,121 B2
(45) Date of Patent: Aug. 7, 2018

(54) PRINTING SYSTEM ARCHITECTURE FOR ENCODING CHIP-LESS RFID TAGS IN REAL TIME

(71) Applicant: XEROX CORPORATION, Norwalk, CT (US)

(72) Inventors: George A. Gibson, Fairport, NY (US); Wayne A. Buchar, Bloomfield, NY (US)

(73) Assignee: XEROX CORPORATION, Norwalk, CT (US)

( * ) Notice: Subject to any disclaimer, the term of this patent is extended or adjusted under 35 U.S.C. 154(b) by 0 days.

(21) Appl. No.: 15/654,490

(22) Filed: Jul. 19, 2017

(65) Prior Publication Data

US 2017/0316295 A1 Nov. 2, 2017

Related U.S. Application Data

(62) Division of application No. 14/733,536, filed on Jun. 8, 2015, now Pat. No. 9,740,975.

(51) Int. Cl.
*G05B 19/00* (2006.01)
*G06K 19/067* (2006.01)
(Continued)

(52) U.S. Cl.
CPC ....... *G06K 19/0672* (2013.01); *H05K 1/0296* (2013.01); *H05K 1/092* (2013.01);
(Continued)

(58) Field of Classification Search
CPC ...... H05K 1/0286; H05K 1/0296; H05K 1/09; H05K 1/092; H05K 1/095; H05K 1/097;
(Continued)

(56) References Cited

U.S. PATENT DOCUMENTS 4,233,383 A 11/1980 Horgan
4,363,711 A 12/1982 Kuehnle
(Continued)

FOREIGN PATENT DOCUMENTS

CN 202650044 1/2013
EP 1218711 B1 12/2004
(Continued)

OTHER PUBLICATIONS

"European Search Report," for corresponding EP Application No. EP 16172200.4 dated Nov. 16, 2016, 7 pages.
(Continued)

*Primary Examiner* — Carlos E Garcia
(74) *Attorney, Agent, or Firm* — MH2 Technology Law Group LLP (57) ABSTRACT

Provided is a method for encoding chipless RFID tags in real-time. The method includes exposing a chipless RFID transponder to a conductive material, the RFID transponder comprising an antenna and a plurality of resonant structures, the plurality of resonant structures together defining a first spectral signature. Each of the plurality of resonant structures includes a respective one of a frequency domain. The method also includes depositing a conductive material on at least one of the resonant structures to short the at least one of the resonant structures. The remainder of the plurality of resonant structures that are not shorted by the conductive material define a second spectral signature for the RFID transponder.

10 Claims, 5 Drawing Sheets

(51) Int. Cl.
*H05K 1/09* (2006.01)
*H05K 3/12* (2006.01)
*H05K 1/02* (2006.01)
*G06K 19/06* (2006.01)

(52) U.S. Cl.
CPC ............... *H05K 3/12* (2013.01); *H05K 3/125* (2013.01); *H05K 3/1241* (2013.01); *G06K 2019/06253* (2013.01); *H05K 1/09* (2013.01); *H05K 1/097* (2013.01); *H05K 2203/13* (2013.01)

(58) Field of Classification Search
CPC ...... H05K 2203/013; H05K 3/02; H05K 3/12; H05K 3/1241; H05K 3/125; H05K 3/20; H05K 3/207; H05K 3/245; H05K 3/246
See application file for complete search history.

(56) References Cited

U.S. PATENT DOCUMENTS

| | | | |
|---|---|---|---|
| 5,381,137 A | 1/1995 | Ghaem et al. | |
| 5,861,809 A | 1/1999 | Eckstein et al. | |
| 7,602,287 B2* | 10/2009 | Trosper | G06K 7/0008 340/10.1 |
| 7,653,982 B2 | 2/2010 | Chopra et al. | |
| 8,324,294 B2 | 12/2012 | Wu et al. | |
| 2005/0179548 A1 | 8/2005 | Kittel et al. | |
| 2008/0218352 A1 | 9/2008 | Miles et al. | |
| 2008/0224871 A1 | 9/2008 | Bolotin et al. | |
| 2009/0017578 A1 | 1/2009 | Walther et al. | |
| 2009/0231139 A1 | 9/2009 | Heurtier | |
| 2009/0301382 A1 | 12/2009 | Patel | |
| 2013/0015248 A1 | 1/2013 | Perret et al. | |
| 2013/0262995 A1* | 10/2013 | Howell | G06Q 10/087 715/273 |
| 2013/0285477 A1 | 10/2013 | Lo et al. | |
| 2013/0300101 A1 | 11/2013 | Wicker et al. | |
| 2015/0102105 A1 | 4/2015 | Perret et al. | |
| 2016/0358058 A1 | 12/2016 | Gibson et al. | |

FOREIGN PATENT DOCUMENTS

| | | |
|---|---|---|
| FR | 2992758 A1 | 3/2014 |
| WO | 2009/126999 A1 | 10/2009 |
| WO | 2015/061827 A1 | 5/2015 |

OTHER PUBLICATIONS

Author Unknown, "Photoresistor," from Wikipedia, https://en.wikipedia.org/wiki/Photoresistor, Dec. 3, 2015, 3 pages.

* cited by examiner

PRINTING SYSTEM ARCHITECTURE FOR ENCODING CHIP-LESS RFID TAGS IN REAL TIME

PRIORITY CLAIM

This application is a divisional application of and claims priority to U.S. patent application Ser. No. 14/733,536, filed on Jun. 8, 2015, now U.S. Pat. No. 9,740,975 issued Aug. 22, 2018, the disclosure of which is hereby incorporated herein by reference in its entirety.

TECHNICAL FIELD

Embodiments described herein relate generally to customized chipless radio frequency identification (RFID) tags, methods of making and using chipless RFID tags, and systems for making customized chipless RFID tags.

BACKGROUND

Radio frequency identification (RFID) technology has gained tremendous popularity as a device for storing and transmitting information. RFID technology utilizes a tag transponder, which is placed on an object, and a reader, also referred to herein as an interrogator, to read and identify the tag. RFID technologies are broadly categorized as using either "active" tags or "passive" tags. Active tags have a local power source (such as a battery) so that the active tag sends a signal to be read by the interrogator. Active tags have a longer signal range. "Passive" tags, in contrast, have no internal power source. Instead, passive tags derive power from the reader, and the passive tag re-transmits or transponds information upon receiving the signal from the reader. Passive tags have a much shorter signal range (typically less than 20 feet).

Both categories of tags have an electronic circuit that is typically in the form of an integrated circuit or silicon chip. The circuit stores and communicates identification data to the reader. In addition to the chip, the tag includes some form of antenna that is electrically connected to the chip. Active tags incorporate an antenna that communicates with the reader from the tag's own power source. For passive tags, the antenna acts as a transducer to convert radio frequency (RF) energy originating from the reader to electrical power. The chip then becomes energized and performs the communication function with the reader.

On the other hand, a chipless RFID tag has neither an integrated circuit nor discrete electronic components, such as the transistor or coil. This feature allows chipless RFID tags to be printed directly onto a substrate at lower costs than traditional RFID tags.

As a practical matter, RFID technology uses radio frequencies that have much better penetration characteristics to material than do optical signals, and will work under more hostile environmental conditions than bar code labels. Therefore, the RFID tags may be read through paint, water, dirt, dust, human bodies, concrete, or through the tagged item itself. RFID tags may be used in managing inventory, automatic identification of cars on toil roads, security systems, electronic access cards, keyless entry and the like.

Antennae are an element of RFID tags that are typically prepared via stamping/etching techniques, wherein a foil master is carved away to create the final structure. For example, each RFID chip is encoded by etching a specific set of resonant structures into a conductive film. These structures create a frequency dependent antenna load which can be used to encode data that is read by observing the reflected or re-irradiated pulse responsive to a broad band interrogating pulses. This process increases the cost of such tags by requiring that each chip must be made individually, currently by laser etching, which is an expensive process.

An alternative approach for printing customized RFID antennas having a unique spectral signature from the "bottom up" have been attempted. Such method involves by printing directly on a substrate using a conductive metal ink. Inkjet printing has been identified as one possible technology for this purpose because it can easily be either used alone to print structures and/or integrated with other processes and machines. For example, hybrid printing technology combines analog printing processes (such as offset lithography, flexography, etching, and letterpress printing) which may be used for printing wire segments of an RFID antenna, with digital printing processes (such as inkjet printing) for printing a conductive ink to interconnect the wire segments. However, inkjet printing has proved unreliable for printing customized RFID antennas because the resolutions of inkjet printheads are inadequate and because the patterns of conductive materials formed by inkjet printheads result in non-uniform printed structures of varying interconnectivities which are unacceptable for RFID structures. Additionally, to print customized RFIDs inexpensive, the conductive particles of the inks must also be inexpensive. However, such particles are usually low cost, low-conductivity materials of varying particle size which affect the overall interconnectivity of the printed structures. On the other hand, conductive ink particles having small particle diameters, having uniform particle diameters, and/or those made of high-conductivity material like gold and silver are expensive, rendering them unusable for providing cheap, customized RFID tags.

Accordingly, inkjet printheads are not suitable for patterning the ink at the scale necessary for encoding individual resonant structures from the "bottom up". As a result, inkjet technology for printing RFID antennas cannot compete with fully lithographic stamping/etching techniques described above, but lithographic stamping/etching processes are not efficient for use in making customized tags and can be expensive because doing so requires laser ablation steps. Accordingly, a lower-cost and more efficient alternative to conventional for making customized RFID tags would be a welcome addition to the art.

SUMMARY

In an embodiment, there is a method for encoding chipless RFID tags in real-time. The method includes exposing a chipless RFID transponder, the RFID transponder comprising an antenna and a plurality of resonant structures, the plurality of resonant structures together defining a first spectral signature. Each of the plurality of resonant structures includes a respective one of a frequency domain. The method also includes depositing a conductive material on at least one of the resonant structures to short the at least one of the resonant structures. The remainder of the plurality of resonant structures that are not shorted by the conductive material define a second spectral signature for the RFID transponder.

In another embodiment, there is a method of tracking inventory. The method comprises placing a chipless RFID transponder on an article. The RFID transponder comprising a plurality of resonant structures that together define a first spectral signature, wherein each of the plurality of resonant structures comprises a respective one of a frequency domain; and depositing a conductive ink on at least one of the resonant structures to short the at least one of the resonant structures, wherein the remainder of the plurality of resonant structures not shorted by the conductive ink define a second spectral signature for the RFID transponder.

In yet another embodiment, there is a method of tracking inventory. The method comprises providing a chipless RFID transponder, the RFID transponder comprising a plurality of resonant structures that together define a first spectral signature, wherein each of the plurality of resonant structures comprises a respective one of a frequency domain; depositing a conductive ink on at least one of the resonant structures to short the at least one of the resonant structures, wherein the remainder of the plurality of resonant structures not shorted by the conductive ink define a second spectral signature for the RFID transponder; and placing the RFID transponder on an article after depositing the conductive material.

In yet another embodiment, there is a chipless RFID transponder, comprising: a plurality of resonant structures that together define a spectral signature of the RFID transponder, wherein each of the plurality of resonant structures comprises a respective one of a frequency domain; and a conductive ink disposed on at least one of the resonant structures, the conductive ink shorting the at least one of the resonant structures, wherein the spectral signature of the RFID is shifted from a natural frequency of the shorted resonant structure.

In even still another embodiment, there is a method of tracking inventory. The method may include providing a chipless RFID transponder, the RFID transponder comprising a plurality of resonant structures that together define a first spectral signature, wherein each of the plurality of resonant structures comprises a respective one of a frequency domain; depositing a conductive ink on at least one of the resonant structures to short the at least one of the resonant structures, wherein the remainder of the plurality of resonant structures not shorted by the conductive ink define a second spectral signature for the RFID transponder; and placing the RFID transponder on an article; and tagging an article with the RFID transponder after depositing the conductive material.

In another embodiment, there is a chipless RFID transponder, comprising: a plurality of resonant structures that together define a spectral signature of the RFID transponder, wherein each of the plurality of resonant structures comprises a respective one of a frequency domain; and a conductive ink disposed on at least one of the resonant structures, the conductive ink shorting the at least one of the resonant structures, wherein the spectral signature of the RFID is shifted from a natural frequency of the shorted resonant structure.

In another embodiment, an article identification system, comprises: a printer for depositing a conductive material on at least one resonant structure of a RFID transponder; and at least one controller in communication with the printer, the controller comprising: at least one memory to store data and instructions; and at least one processor configured to access the at least one memory and to execute instructions, the instructions comprising: retrieve identification data from the at least one memory, the identification data corresponding to identity information of an article, retrieve design data of a chipless RFID transponder, the design data comprising frequency domain information corresponding to each of a plurality of resonant structures of the chipless RFID transponder, generate a code based on the identification data and the design data; associate a spectral signature with the code, and generate pattern data by identifying, from the design data, which of the plurality of resonant structures together define the spectral signature and which of the plurality of resonant structures do not contribute to the spectral signature; and activate the printer to deposit the conductive material according to the pattern data such that the conductive material shorts at least one resonant structure of the RFID transponder such that it is frequency shifted to a domain outside the spectral signature.

In another embodiment, there is a method for customizing a generic RFID transponder. The method includes exposing at least one resonant structure of the generic RFID transponder to a conductive material; and changing a resonance of at least one resonant structures of the RFID transponder by depositing a conductive material on the at least one resonant structure, wherein the changing comprises electrically shorting the resonant structure such that its resonance shifts from a first resonance to a second resonance.

Additional advantages of the embodiments will be set forth in part in the description which follows, and in part will be understood from the description, or may be learned by practice of the embodiments. The advantages will be realized and attained by means of the elements and combinations particularly pointed out in the appended claims.

It is to be understood that both the foregoing general description and the following detailed description are exemplary and explanatory only and are not restrictive of the embodiments, as claimed.

BRIEF DESCRIPTION OF THE DRAWINGS

The accompanying drawings, which are incorporated in and constitute a part of this specification, illustrate embodiments of the present teachings and together with the description, serve to explain the principles of the disclosure.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts. It will be understood that the structures depicted in the figures may include additional features not depicted for simplicity, while depicted structures may be removed or modified.

Notwithstanding that the numerical ranges and parameters setting forth the broad scope of the embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

The following embodiments are described for illustrative purposes only with reference to the Figures. Those of skill in the art will appreciate that the following description is exemplary in nature, and that various modifications to the parameters set forth herein could be made without departing from the scope of the present embodiments. It is intended that the specification and examples be considered as examples only. The various embodiments are not necessarily mutually exclusive, as some embodiments can be combined with one or more other embodiments to form new embodiments.

As used herein, the term "chipless" as used herein to describe RFID transponders means that the RFID transponder has neither an integrated circuit nor discrete electronic components, such as a transistor or coil.

As used herein, the term "resonant structure" means a structure having an associated resonance corresponding to a characteristic frequency.

As used herein, the term "spectral signature" refers to at least one identifying resonance associated with an applied excitation frequency. The spectral signature may have at least one magnitude component and at least one phase component.

As used herein, the term "tag" refers to a transponder or a combination of a transponder and carrier on which the transponder is disposed. A tag may be attached to articles.

As used herein, the term "transponder" refers to a device that receives signals, such as those transmitted by an interrogator, and sends signals in response to the received signals.

As used herein, the term "etched" refers to a process, typically used in photolithography, by which portions of a material are chemically removed.

As used herein, the term "security overlayer" means a backing layer that when tampered with, damages, destroys or otherwise modifies a structure on which the security overlayer is disposed.

As used herein, the term "generic RFID transponder" means an RFID transponder that has an associated resonant structure for each frequency domain applied by a transmitter, such as an interrogator.

A lower cost alternative process for making customized RFID tags and that solves the resolution problems of the prior art begins with providing identical RFID transponders. The identical transponders contain one resonant structure for every wavelength interval that can be cleanly resolved by a corresponding RFID reader. One or more of the transponder's resonance structures may then be shorted, for example, by use of a conductive ink deposited over the one or more of the resonance structures, and drying the conductive ink to form a film that shorts the resonant structures. The conductive material may comprise a conductive ink as known in the current art, such as the conductive inks disclosed in U.S. Pat. No. 8,324,294, the entire contents of which are incorporated by reference herein in its entirety. In an embodiment the conductive material may comprise an ink composition comprising metal nanoparticles, wherein the metal nanoparticles may comprise silver nanoparticles. The nanoparticles may be present in an amount of from about 10 to about 85 percent by weight of the total weight of the ink composition, or from about 20 to about 60 percent by weight of the total weight of the ink composition. The term "nano" as used in "metal nanoparticles" refers to, for example, a particle size of less than about 1,000 nm, such as, for example, from about 0.5 nm to about 1,000 nm, from about 1 nm to about 500 nm, from about 1 nm to about 100 nm, from about 1 nm to about 25 nm or from about 1 to about 10 nm. The particle size refers to the average diameter of the metal particles, as determined by TEM (transmission electron microscopy) or other suitable method. Generally, a plurality of particle sizes may exist in the metal nanoparticles obtained from the process described herein. In embodiments, the existence of different sized metal-containing nanoparticles is acceptable. Similar compositions are known and may employ any of a number of conductive materials including at least one inherently highly conductive material copper, aluminum, silver or gold. The conductive material of the embodiments may include conductive polymers which may be included in a conductive ink composition. Other conductive materials include any conductive films, such as thin conductive layer including layers transferred from thermal ribbon and films of conductive paint. Shorting of a resonant structure frequency shifts its natural frequency, removing it from the range of the interrogation and analysis. In an exemplary system, a controller associated with a deposition system, such as a printer, for example, an inkjet printer, generates a code to be encoded on the generic RFID transponder, associates the code with the identity information from the print controller and encodes that information onto the RFID tag, for example, by using an ink jet or similar print station to apply conductive material, such as conductive ink, to selected ones of the plurality of resonant structures. Such a method allows for use of low cost lithographic techniques to be employed for manufacturing RFID antennae, and low cost deposition techniques, such as ink jet printing, to deposit the conductive materials—without the need for high resolution of the deposited patterns—thereby reducing the overall manufacturing costs. This is because the line width uniformity required for some RFID transponders are +/−2.5□ m, a factor of 5 to 10 better than that achievable with available ink jet printers. Accordingly, embodiments herein solve this issue by modifying existing RFID transponders, for example, by printing patterns of conductive films in a manner that shorts select ones of an RFID transponder's resonant structures. One method for printing the patterns of conductive ink can use conventional inkjet printers to jet conductive material onto the select ones of the resonant structures because shorting the resonant structures does not require the line width uniformity that fabricating the resonant structures from the "bottom up" would otherwise require.

Figure 1:
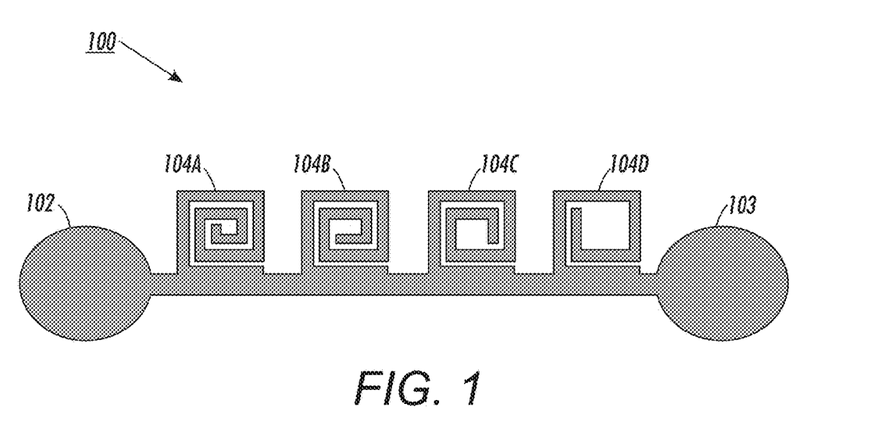
FIG. 1 depicts a chipless RFID transponder that has a first spectral signature.

FIG. 1 is a view of a chipless RFID transponder 100. In an embodiment, chipless RFID transponder may be as described in WO/2009/126999, the contents of which are hereby incorporated by reference herein in its entirety. The RFID transponder may be formed by lithography, etching/stamping or the like. For example, the elements of the RFID transponder responsible for generating the transponder's spectral signature may each or independently be formed as etched structures. RFID transponder 100 may also be a conductive-ink based chipless RFID transponder, wherein all the components, including at least one resonant structure, are formed via patterning of films of conductive material including by printing, such as inkjet printing, a conductive ink.

RFID transponder 100 includes at least one antenna, such as receiving antenna 102 and transmitting antenna 104. Antenna 102 and 103 may be incorporated as part of a circuit that includes a plurality of resonant structures 104a-104d that, together, define a spectral signature of the RFID transponder. For example, each of the plurality of resonant structures 104a-d may exhibit a respective resonance. The resonance is associated with a natural frequency that is dependent upon the corresponding resonant structure's geometry, among other factors. Accordingly, each of the plurality of resonant structures 104a-d may be used for independent encoding of a single bit of information. The resonant structure may be a spiral resonator, such as that shown in FIG. 1, or may be selected from other resonant structures such as, but not limited to, meander and fractal shaped resonant structures.

The presence of any one resonant structure 104a-104d, each having a particular resonant frequency, results in a corresponding attenuation at that frequency in the response of the overall RFID transponder 100. Accordingly, the presence or absence of each resonance structure 104a-104d determines the presence or absence of a corresponding resonance having a particular characteristic frequency and phase response, which may be used, for example, to encode one bit of digital information.

Figure 2:
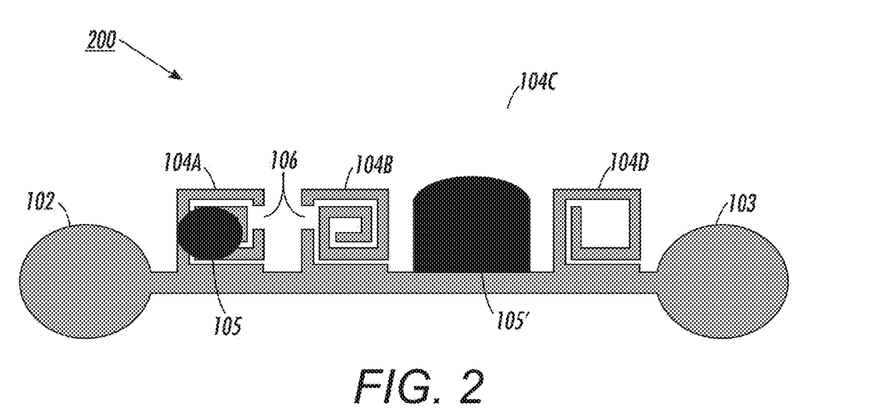
FIG. 2 depicts the chipless RFID transponder of FIG. 1 modified to have a second spectral signature by virtue of conductive material disposed on and shorting at least one of the resonant structures.

FIG. 2 is a view of a chipless RFID transponder 200 of an embodiment. RFID transponder 200 may be a modified version of RFID transponder 100. For example, RFID 200 additionally includes conductive material disposed on at least one of the resonant structures 104a-104d. In other words, RFID transponder 200 includes at least one antenna, such as receiving antenna 102 and transmitting antenna 104. Antenna 102 and 103 may be incorporated as part of a circuit that includes a plurality of resonant structures 104a-104d that, together, define a spectral signature of the RFID transponder 200. Additionally, RFID transponder 200 includes conductive material 105 disposed on at least one resonant structure, such as shown for resonant structures 104a and 104c. It is noted that conductive material 105 on resonant structure 104a may be the same or different than the conductive material 105 on resonant structure 104c. Additionally, conductive material 105 may be the same or different than the material of the resonant structures 104a-104d, and may be the same or different than the material of the antennas 102 and 103.

Conductive materials 105 may be initially deposited as a conductive ink, for example, via a printer such as an inkjet printer. Accordingly, conductive materials may be deposited in a predetermined pattern. In an embodiment, the conductive material is deposited as a film to cover at least a portion of the one or more resonant structures 104a-104d.

The conductive material 105 disposed on at least one resonant structure serves to short the corresponding underlying resonant structure(s), thereby "turning off" the resonant response of that resonant structure(s), or, at the very least, shifting the natural frequency of the resonant structure(s). In other words, the conductive material, such as a conductive ink, shifts the spectral response of the RFID transponder from a natural frequency of the shorted resonant structure(s). Accordingly, by virtue of depositing conductive material in the predetermined pattern, one or more of the resonant structures may be shorted by the conductive material.

Depositing the conductive material may include completely covering the at least one of the resonant structures with the conductive material as shown for resonant structure 104c which is covered by conductive material 105'. In such an embodiment, the conductive material 105' covers not just the geometry of the resonant structure but all of the interstitial spaces of the geometry. In one aspect, the conductive material covers enough of the resonant structure to shifts a natural frequency of the at least one of the resonant structures. For example, the conductive material deposited on the at least one of the resonant structures shifts the natural frequency of the resonant structure to a frequency outside of microwave detection. In an embodiment, the conductive material is deposited in such a way that the at least one resonant structure has no electromagnetic resonance. Accordingly, in an embodiment, after the depositing the conductive material, the at least one resonant structure does not contribute to the second spectral signature of transponder 200.

In addition to depositing conductive material on at least one of the resonant structures, portions of the at least one resonant structure may be removed. For example, portions of the resonant structure 104a not covered by conductive material 105 may be removed. In an embodiment, at least a portion of at least one of the resonant structures not covered by conductive material can be removed by mechanical cutting or laser ablation. In fact, at least a portion 106 of the resonant structure on which conductive material is to be deposited can be removed prior to depositing the conductive material. In some embodiments, some of the resonant structures in the RFID transponder may be destroyed or otherwise rendered useless for detection by laser ablation while others of the resonant structures may be shorted with conductive ink, while still others may both be laser ablated and shorted with conductive ink. In some embodiments, some of the resonant structures may be partially covered with the conductive material while others may be completely covered, such as substantially completely covered so as to shift their resonance to either a resonance outside of microwave detection or shifted to be without resonance, such as no electromagnetic resonance.

Figure 3A:
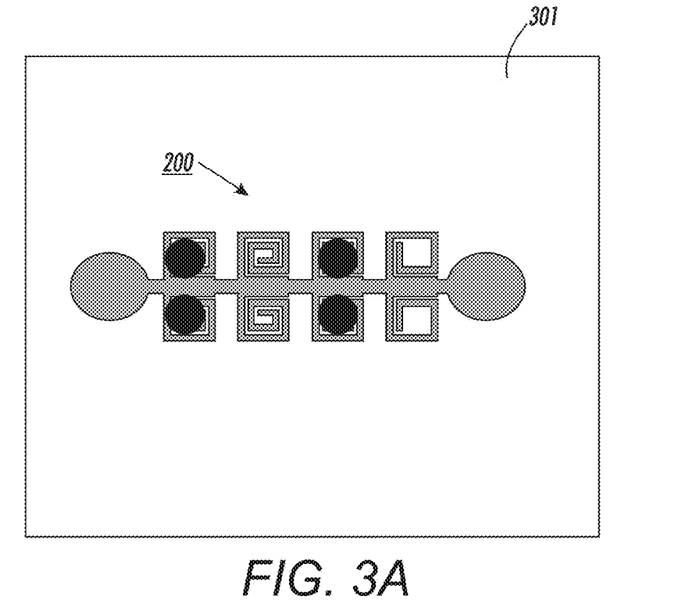
FIGS. 3A-B depicts the chipless RFID transponder of FIG. 2 disposed on a carrier (FIG. 3A), and disposed between the carrier and an overlayer (FIG. 3B).
Figure 3B:
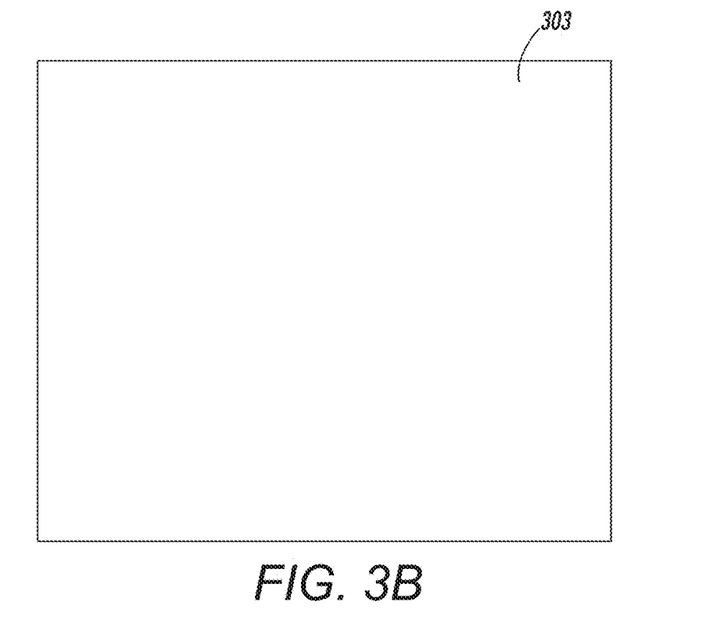

As shown in FIG. 3A, the transponder 200 may be disposed on a carrier 301 such as directly on an article or on an intermediate adhesive backing for attaching onto an article. The carrier 301 may be a substrate on which the RFID transponder is initially fabricated or may be a carrier on which an RFID transponder is transferred onto after it is fabricated. An adhesive backing carrier 301 allows the RFID transponder to be easily attached (i.e., tagged) onto articles. Additionally, to prevent further manipulation of the RFID transponder that is modified from its natural frequency response by the deposited conductive material over one or more of the resonant structures, a security overlayer 303 may be placed over the RFID transponder.

Figure 4:
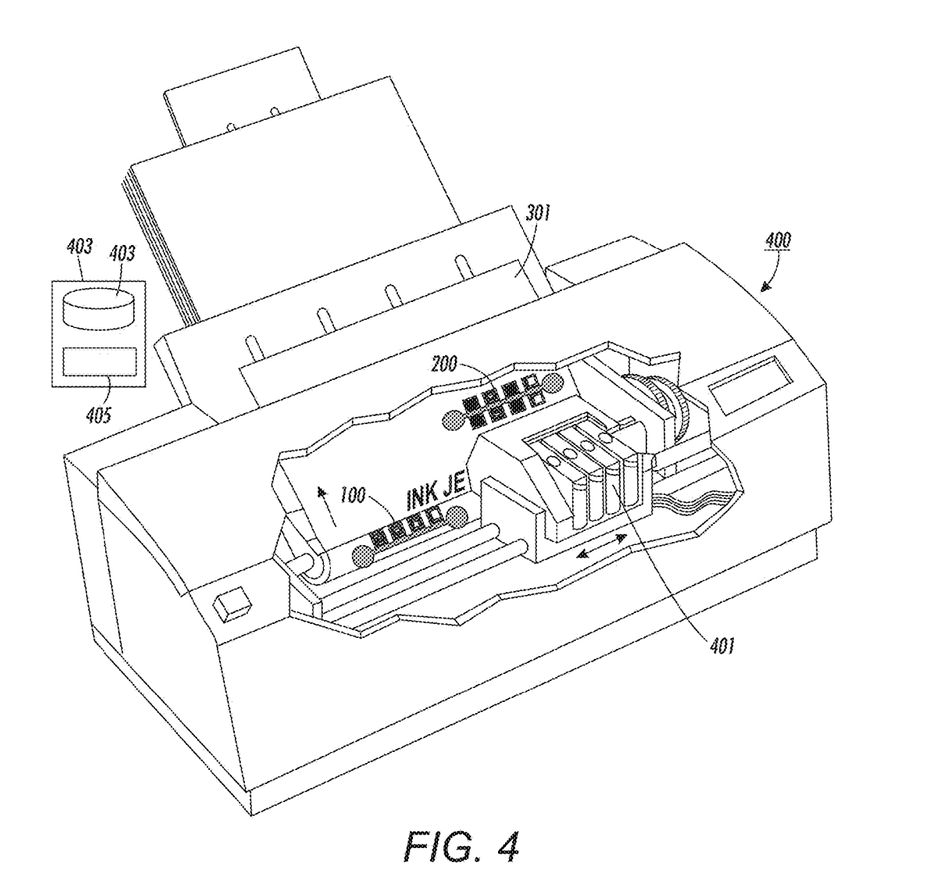
FIG. 4 illustrates a printer and controller as part of an article identification system.

In an embodiment, one or more of identical RFID transponders may be applied to a carrier. The RFID tags may all have identical coding via the presence of resonant structures for each frequency domain. For example, the identical RFID transponders may be conventional, RFID transponders having a first frequency response, such as RFID transponder 100. As shown in FIG. 4 each of the RFID transponders 100 may then be further processed by, for example, a printer 400, having an ink jet printhead 401 or similar writing head that is capable of depositing conductive material 105, for example, conductive inks or films, in a predetermined pattern. As described above, the deposited conductive material 105 may selectively short out one or more of the resonant structures, thereby resulting in forming an RFID transponder 200 having a second frequency response, as described above. That is, once shorted, the resonant structure(s) on which the conductive ink is deposited by the printhead 401 are frequency shifted to a domain outside the range of interrogating pulses—hence encoded as a one or zero after or immediately prior to tagging the RFID transponder onto the article.

The printer 400 may be incorporated for use with an article identification system. The article identification may include at least one printer and at least one controller 403 in communication 402 with the printer 400. The controller may include at least one memory 405 to store data and instructions; and at least one processor configured to access the at least one memory and to execute instructions. The instructions can include: retrieve identification data from the at least one memory, the identification data corresponding to identity information of an article; retrieve design data of a chipless RFID transponder, the design data comprising frequency domain information corresponding to each of a plurality of resonant structures of the chipless RFID transponder such as that of RFID 100; generate a code based on the identification data and the design data; associate a spectral signature with the code; generate pattern data by identifying, from the design data, which of the plurality of resonant structures of RFID 100 together define the spectral signature and which of the plurality of resonant structures of RFID 100 do not contribute to the spectral signature; and activate the printer, for example, the printhead 401 of the printer 400 to deposit the conductive material, such as conductive material 105 according to the pattern data such that the conductive material shorts at least one resonant structure of the RFID transponder and such that it is frequency shifted to a domain outside the spectral signature to form RFID transponder 200.

Figure 5A:
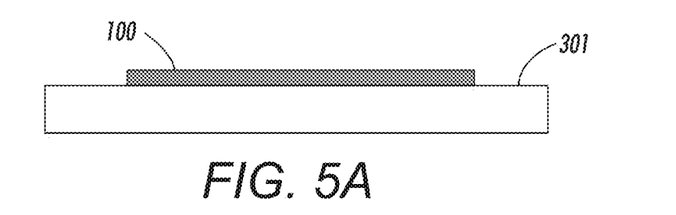
FIGS. 5A-5C illustrate processing steps of a method for encoding chipless RFID tags of an embodiment.
Figure 5B:
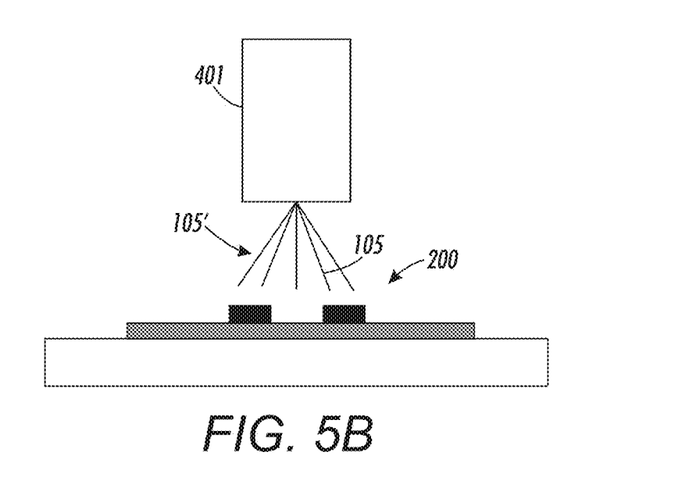
Figure 5C:
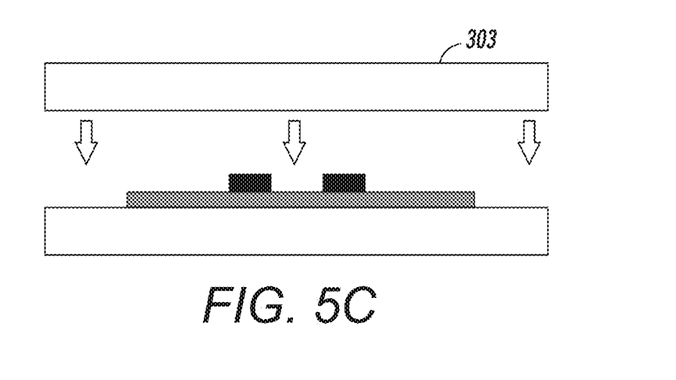
Figure 6A:
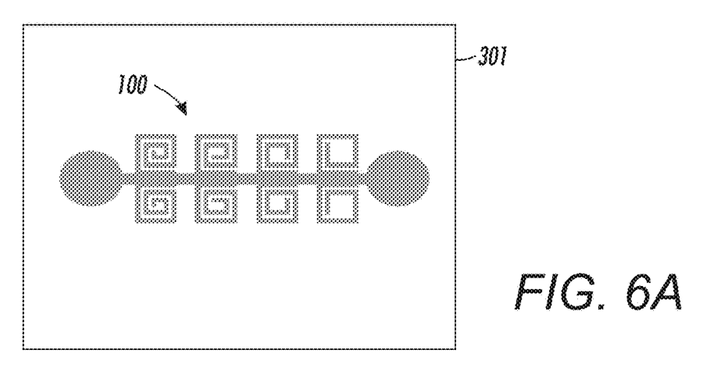
FIGS. 6A-6C are top views of the processing steps of FIGS. 5A-5C, respectively.
Figure 6B:
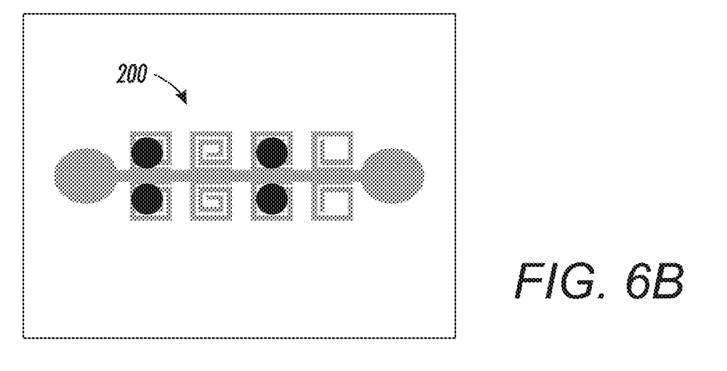
Figure 6C:
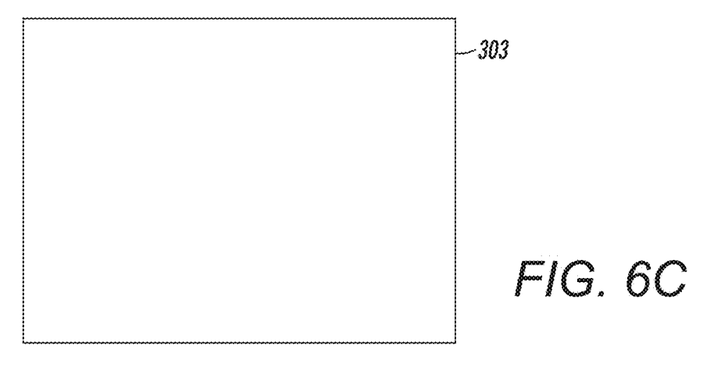

FIGS. 5A-5C illustrate a method for encoding chipless RFID tags, for example, in real-time. FIGS. 6A-6C are top-views of FIGS. 5A-5C, respectively. In, the method a chipless RFID transponder 100 is provided as shown in FIGS. 5A and 6A. The RFID transponder may be provided on a carrier 301. The RFID transponder may be configured as described for RFID transponder 100 described above. In other words, the RFID transponder comprises an antenna and a plurality of resonant structures. The method continues at FIGS. 5A and 6A with depositing a conductive material 105 on at least one of the resonant structures to short the at least one of the resonant structures to form RFID transponder 200. Conductive material 105 may be a conductive ink deposited onto at least one resonant structure according to a predetermined pattern, such as via jetting pattern 105' from an inkjet printhead 401. Alternatively, conductive material 105 may be deposited as a film. In some embodiments, conductive material may be deposited by thermal transfer, xerography or screen printing.

The plurality of resonant structures in the RFID transponder 100 together define a first spectral signature. That is, each of the plurality of resonant structures includes a respective one of a frequency domain. Depositing the conductive material on at least one of the resonant structures changes the first spectral signature of the RFID transponder, for example, by shifting a natural frequency of the at least one resonant structure to another frequency that an interrogator may not be able to read. That is, the remainder of the plurality of resonant structures in RFID transponder 200 that are not shorted by the conductive material define a second spectral signature for the RFID transponder, and the second spectral signature may be different than the first spectral signature. The first spectral signature may comprise a first absorbance range for interrogating pulses and the second spectral signature comprises a second absorbance range for the interrogating pulses. Additionally, as shown in FIGS. 5C and 6C, an overlayer such as a security overlayer 303 may be added over the RFID transponder 300 and over the carrier 301. The overlayer 303 may be non-conductive and abrasion resistant.

The RFID transponder 200, which may be disposed between a carrier 301 and an overlayer 303, may be placed on an article. However, RFID transponder 100, which may be disposed only on carrier 301 (i.e., without overlayer 303), may first be placed on an article followed by addition of the conductive material over at least one of its resonant structures and subsequent addition of overlayer 303. In other words, RFID transponder 200 may be formed in situ while disposed on an article.

In summary embodiments described herein lower the cost of RFID tags and reduce the complexity and improve the reliability of processes in which an RFID tag is associated with a given article.

While the embodiments have been illustrated respect to one or more implementations, alterations and/or modifications can be made to the illustrated examples without departing from the spirit and scope of the appended claims. In addition, while a particular feature of the embodiments may have been disclosed with respect to only one of several implementations, such feature may be combined with one or more other features of the other implementations as may be desired and advantageous for any given or particular function.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of three A, B and C.

Other embodiments will be apparent to those skilled in the art from consideration of the specification and practice of the descriptions disclosed herein. It is intended that the specification and examples be considered as exemplary only, with a true scope and spirit of the embodiments being indicated by the following claims.

What is claimed is:

1. A method of tracking inventory, comprising:
   placing a chipless RFID transponder on an article, the RFID transponder comprising
      a plurality of resonant structures that together define a first spectral signature, wherein each of the plurality of resonant structures comprises a respective one of a frequency domain; and
   subsequently depositing a conductive ink on at least one of the resonant structures to short the at least one of the resonant structures, wherein the remainder of the plurality of resonant structures not shorted by the conductive ink define a second spectral signature for the RFID transponder,
   wherein the depositing comprises ejecting the conductive ink from an inkjet printhead onto the at least one of the resonant structures.

2. The method of claim 1, further comprising detecting a spectral response of the RFID transponder.

3. The method of claim 2, wherein the detecting comprises administering at least one interrogating pulse emitted by an interrogator, the at least one interrogating pulse comprising a spectral range.

4. The method of claim 3, wherein the depositing of the conductive ink on a least one of the resonant structures frequency shifts the at least one of the resonant structures to a domain outside the spectral range of the at least one interrogating pulse.

5. The method of claim 1, further comprising tagging an article with the RFID transponder prior to depositing the conductive ink.

6. The method of claim 1, wherein the conductive ink comprises particles dispersed in a carrier and wherein the particles comprise at least one material selected from copper or aluminum.

7. A method of tracking inventory, comprising:
  providing a chipless RFID transponder, the RFID transponder comprising
    a plurality of resonant structures that together define a first spectral signature, wherein each of the plurality of resonant structures comprises a respective one of a frequency domain;
  depositing a conductive material on at least one of the resonant structures to short the at least one of the resonant structures, wherein the remainder of the plurality of resonant structures not shorted by the conductive material define a second spectral signature for the RFID transponder;
  placing the RFID transponder on an article; and
  placing the RFID transponder on an article after depositing the conductive material,
  wherein the conductive material comprises conductive ink, and the depositing comprises ejecting the conductive ink from an inkjet printhead onto the at least one of the resonant structures.

8. The method of claim 7, wherein the conductive material comprises a conductive film.

9. The method of claim 7, wherein the deposited conductive material forms a film on at least one of the resonant structures.

10. The method of claim 7, wherein the conductive material comprises a conductive ink, the conductive ink comprising particles dispersed in a carrier and wherein the particles comprise at least one material selected from copper or aluminum.

* * * * *